United States Patent
Kwak et al.

(10) Patent No.: US 10,705,137 B2
(45) Date of Patent: Jul. 7, 2020

(54) METHOD OF TESTING SEMICONDUCTOR PACKAGES

(71) Applicant: SEMES CO., LTD., Cheonan-si, Chungcheongnam-do (KR)

(72) Inventors: Soo Man Kwak, Cheonan-si (KR); Hyun Chai Jung, Cheonan-si (KR); Jin Gook Kim, Cheonan-si (KR)

(73) Assignee: SEMES CO., LTD., Cheonan-si, Chungcheongnam-Do (KR)

( * ) Notice: Subject to any disclaimer, the term of this patent is extended or adjusted under 35 U.S.C. 154(b) by 326 days.

(21) Appl. No.: 15/896,399

(22) Filed: Feb. 14, 2018

(65) Prior Publication Data

US 2018/0246163 A1     Aug. 30, 2018

(30) Foreign Application Priority Data

Feb. 28, 2017    (KR) .................... 10-2017-0025831

(51) Int. Cl.
    *G01R 31/28*      (2006.01)
    *H01L 21/66*      (2006.01)
    *G01R 31/382*      (2019.01)

(52) U.S. Cl.
    CPC ..... *G01R 31/2875* (2013.01); *G01R 31/2891* (2013.01); *G01R 31/382* (2019.01); *H01L 22/34* (2013.01)

(58) Field of Classification Search
    CPC .............. G01R 1/0458; G01R 31/282; G01R 31/2849; G01R 31/2855; G01R 31/2862; G01R 31/2863; G01R 31/2872; G01R 31/2874; G01R 31/2875; G01R 31/2877; G01R 31/2891; G01R 31/382; H01L 21/67248; H01L 22/34
    USPC .............. 324/750.1, 750.03, 750.04, 750.05, 324/750.06, 750.07, 750.09, 750.11, 324/756.02, 762.01
See application file for complete search history.

(56) References Cited

U.S. PATENT DOCUMENTS

| | | | | |
|---|---|---|---|---|
| 5,788,084 A | * | 8/1998 | Onishi | G01R 31/2893 209/573 |
| 6,091,062 A | * | 7/2000 | Pfahnl | G01R 31/2874 219/209 |
| 6,605,955 B1 | * | 8/2003 | Costello | H01L 21/67109 324/750.09 |

(Continued)

FOREIGN PATENT DOCUMENTS

KR      10-0505070      8/2005

*Primary Examiner* — Steven L Yeninas
(74) *Attorney, Agent, or Firm* — Kile Park Reed & Houtteman PLLC

(57) ABSTRACT

A method of testing semiconductor packages, which performs an electrical test on the semiconductor packages after receiving the semiconductor packages into insert pockets of a test tray and connecting with sockets of a tester by using pusher units each including a heater, includes receiving temperature information of the semiconductor packages from the tester while testing the semiconductor packages, calculating an overall average temperature of the semiconductor packages from the received temperature information, and individually controlling operations of heaters of the pusher units based on difference values between the overall average temperature and individual temperatures of the semiconductor packages.

19 Claims, 6 Drawing Sheets

(56) References Cited

U.S. PATENT DOCUMENTS

| | | | |
|---|---|---|---|
| 7,498,830 B2* | 3/2009 | Nakamura | G05D 23/1919 |
| | | | 324/750.03 |
| 10,049,905 B2* | 8/2018 | Higashi | H05B 1/0233 |
| 10,049,948 B2* | 8/2018 | Gaff | H01L 21/67248 |
| 10,094,871 B2* | 10/2018 | Itakura | G01R 31/64 |
| 2004/0232933 A1* | 11/2004 | Maesaki | G01R 31/2862 |
| | | | 324/750.07 |
| 2011/0267082 A1* | 11/2011 | Fregeau | G01R 31/2874 |
| | | | 324/750.03 |
| 2013/0229198 A1* | 9/2013 | Fregeau | G01R 31/2874 |
| | | | 324/750.01 |

\* cited by examiner

METHOD OF TESTING SEMICONDUCTOR PACKAGES

CROSS-REFERENCE TO RELATED APPLICATION

This application claims the priority benefit of Korean Patent Application No. 10-2017-0025831 filed on Feb. 28, 2017, and all the benefits accruing therefrom under 35 U.S.C. § 119, the contents of which are incorporated by reference in their entirety.

BACKGROUND

The present disclosure relates to a method of testing semiconductor packages. More specifically, the present disclosure relates to a method of testing semiconductor packages received into insert pockets of a test tray by using a test handler and a tester.

In general, semiconductor devices may be formed on a silicon wafer used as a semiconductor substrate by repeatedly performing a series of manufacturing processes, and the semiconductor devices formed as described above may be formed into semiconductor packages through a dicing process, a bonding process, and a packaging process.

The semiconductor packages may be determined as defective products or non-defective products by an electrical test process. The electrical test process may be performed by a test handler for handling the semiconductor packages and a tester for supplying test signals and analyzing output signals from the semiconductor packages.

In the electrical test process, the semiconductor packages may be received into insert pockets of a test tray, respectively, and then be connected with test sockets of the tester by pusher units. The tester may include an interface board, and the test sockets may be disposed on the interface board. The test handler may include a test chamber in which the electrical test process is performed, and the pusher units may be disposed in the test chamber.

Further, the test handler may include sensors for measuring a temperature in the test chamber and temperature adjusting units for adjusting the temperature. For example, heaters for heating an inside of the test chamber and cooling units for injecting a cooling gas to cool the inside of the test chamber may be disposed in the test chamber, and the temperature in the test chamber may be controlled based on the values measured by the sensors.

However, because heat may be generated in the semiconductor packages while testing the semiconductor packages, and distances of the semiconductor packages from the heaters and the cooling units are different from one another, it is difficult to uniformly maintain the semiconductor packages at a predetermined test temperature.

SUMMARY

The present disclosure provide a method of testing semiconductor packages capable of uniformly controlling temperatures of the semiconductor packages in an electrical test process.

In accordance with an aspect of the present disclosure, a method of testing semiconductor packages, which performs an electrical test on the semiconductor packages after receiving the semiconductor packages into insert pockets of a test tray and connecting with sockets of a tester by using pusher units each comprising a heater, may include receiving temperature information of the semiconductor packages from the tester while testing the semiconductor packages, calculating an overall average temperature of the semiconductor packages from the received temperature information, and individually controlling operations of heaters of the pusher units based on difference values between the overall average temperature and individual temperatures of the semiconductor packages.

In accordance with some exemplary embodiments of the present disclosure, set temperatures of the heaters may be individually adjusted to compensate for the difference values between the overall average temperature and the individual temperatures of the semiconductor packages in the individually controlling the operations of the heaters.

In accordance with some exemplary embodiments of the present disclosure, thermoelectric elements may be used as the heaters, and driving powers applied to the thermoelectric elements may be individually increased or decreased to compensate for the difference values between the overall average temperature and the individual temperatures of the semiconductor packages in the individually controlling the operations of the heaters.

In accordance with some exemplary embodiments of the present disclosure, the method may further include controlling overall the operations of the heaters based on a difference value between the overall average temperature and a predetermined test reference temperature of the semiconductor packages.

In accordance with some exemplary embodiments of the present disclosure, the set temperatures of the heaters may be adjusted as a whole to compensate for the difference value between the overall average temperature and the test reference temperature in the controlling overall the operations of the heaters.

In accordance with some exemplary embodiments of the present disclosure, the driving powers applied to the thermoelectric elements may be increased or decreased as a whole to compensate for the difference value between the overall average temperature and the test reference temperature in the controlling overall the operations of the heaters.

In accordance with some exemplary embodiments of the present disclosure, a temperature of a semiconductor package deviating from a predetermined temperature range may be excluded from the calculating the overall average temperature of the semiconductor packages.

In accordance with an aspect of the present disclosure, a method of testing semiconductor packages, which performs an electrical test on the semiconductor packages after receiving the semiconductor packages into insert pockets of a test tray and connecting with sockets of a tester by using pusher units each comprising a heater, may include receiving temperature information of the semiconductor packages from the tester while testing the semiconductor packages, calculating an overall average temperature of the semiconductor packages from the received temperature information, compensating set temperatures of heaters of the pusher units as a whole with a first compensation value to compensate for a first difference value between the overall average temperature and a predetermined test reference temperature of the semiconductor packages, and individually compensating the set temperatures of the heaters with second compensation values to compensate for second difference values between the overall average temperature and individual temperatures of the semiconductor packages.

In accordance with some exemplary embodiments of the present disclosure, the set temperatures of the heaters compensated with the first compensation value and the second compensation values may be used to test subsequent semiconductor packages.

In accordance with some exemplary embodiments of the present disclosure, a temperature of a semiconductor package deviating from a predetermined temperature range is excluded from the calculating the overall average temperature of the semiconductor packages.

In accordance with an aspect of the present disclosure, a method of testing semiconductor packages, which performs an electrical test on the semiconductor packages after receiving the semiconductor packages into insert pockets of a test tray and connecting with sockets of a tester by using pusher units each comprising a heater, may include repeatedly performing a test process on a predetermined number of test trays in which semiconductor packages are received, receiving temperature information of the semiconductor packages received in the test trays from the tester while repeatedly performing the test process, calculating an overall average temperature of the semiconductor packages received in the test trays from the received temperature information, calculating individual average temperatures of semiconductor packages received in insert pockets at the same locations of the test trays from the received temperature information, respectively, and individually controlling operations of heaters of the pusher units based on difference values between the overall average temperature and individual average temperatures of the semiconductor packages.

In accordance with some exemplary embodiments of the present disclosure, the method may further include controlling overall the operations of the heaters based on a difference value between the overall average temperature and a predetermined test reference temperature of the semiconductor packages.

In accordance with some exemplary embodiments of the present disclosure, set temperatures of the heaters may be individually adjusted to compensate for the difference values between the overall average temperature and the individual average temperatures of the semiconductor packages in the individually controlling the operations of the heaters, and the set temperatures of the heaters may be adjusted as a whole to compensate for the difference value between the overall average temperature and the test reference temperature in the controlling overall the operations of the heaters.

In accordance with some exemplary embodiments of the present disclosure, thermoelectric elements may be used as the heaters, driving powers applied to the thermoelectric elements may be individually increased or decreased to compensate for the difference values between the overall average temperature and the individual average temperatures of the semiconductor packages in the individually controlling the operations of the heaters, and the driving powers applied to the thermoelectric elements may be increased or decreased as a whole to compensate for the difference value between the overall average temperature and the test reference temperature in the controlling overall the operations of the heaters.

In accordance with some exemplary embodiments of the present disclosure, a temperature of a semiconductor package deviating from a predetermined temperature range may be excluded from the calculating the overall average temperature and the calculating the individual average temperatures.

In accordance with an aspect of the present disclosure, a method of testing semiconductor packages, which performs an electrical test on the semiconductor packages after receiving the semiconductor packages into insert pockets of a test tray and connecting with sockets of a tester by using pusher units each comprising a heater, may include repeatedly performing a test process on a predetermined number of test trays in which semiconductor packages are received, receiving temperature information of the semiconductor packages received in the test trays from the tester while repeatedly performing the test process, calculating an overall average temperature of the semiconductor packages received in the test trays from the received temperature information, calculating individual average temperatures of semiconductor packages received in insert pockets at the same locations of the test trays from the received temperature information, respectively, compensating set temperatures of heaters of the pusher units as a whole with a first compensation value to compensate for a first difference value between the overall average temperature and a predetermined test reference temperature of the semiconductor packages, and individually compensating the set temperatures of the heaters with second compensation values to compensate for second difference values between the overall average temperature and individual average temperatures of the semiconductor packages.

In accordance with some exemplary embodiments of the present disclosure, the set temperatures of the heaters compensated with the first compensation value and the second compensation values may be used to test subsequent semiconductor packages.

In accordance with some exemplary embodiments of the present disclosure, a temperature of a semiconductor package deviating from a predetermined temperature range may be excluded from the calculating the overall average temperature and the calculating the individual average temperatures.

In accordance with some exemplary embodiments of the present disclosure, each of the pusher units may include one heater and one pusher tip or a plurality of pusher tips.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Exemplary embodiments can be understood in more detail from the following description taken in conjunction with the accompanying drawings, in which.

Figure 1:
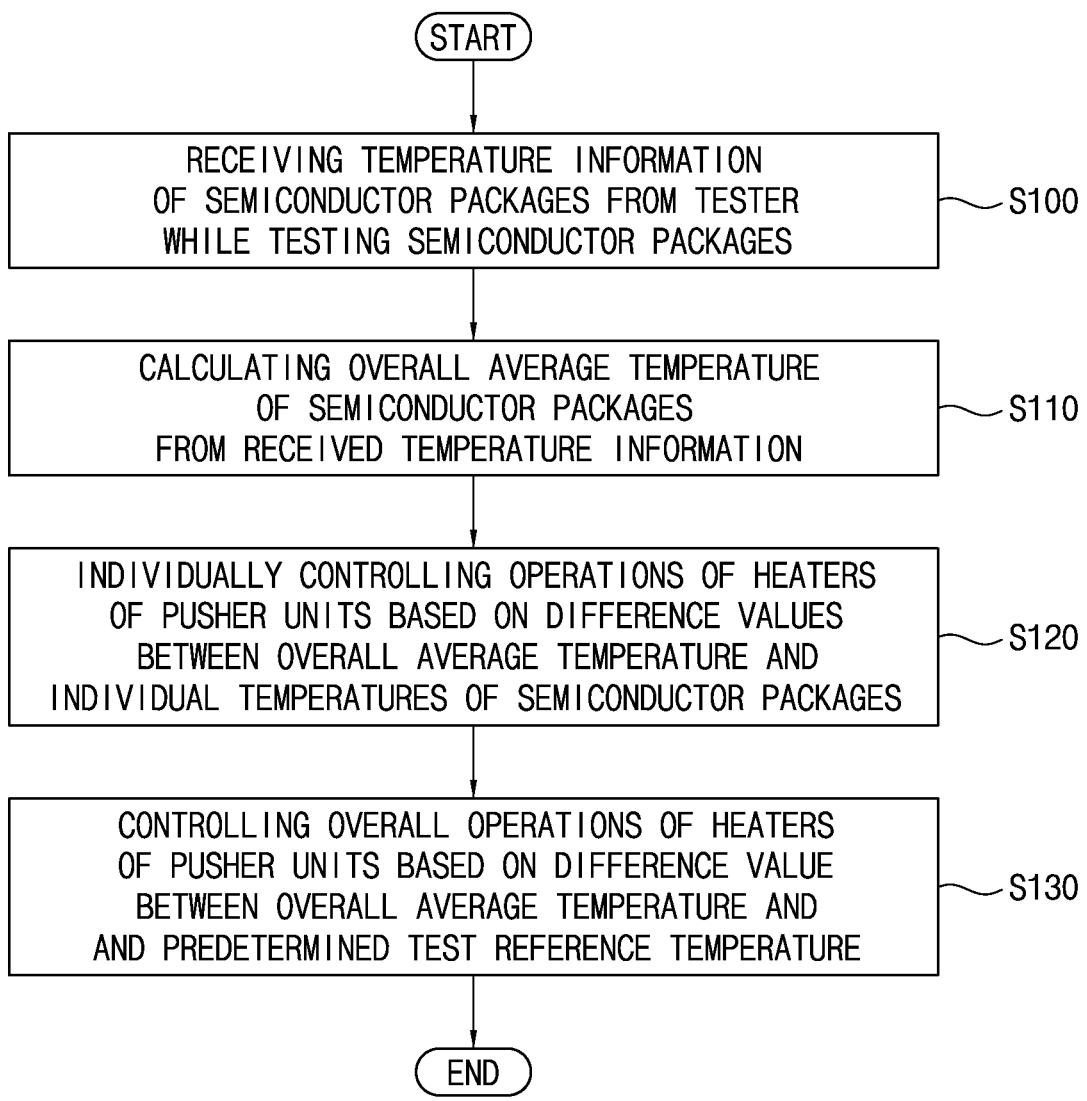
FIG. 1 is a flowchart illustrating a method of testing semiconductor packages in accordance with an exemplary embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

Figure 2:
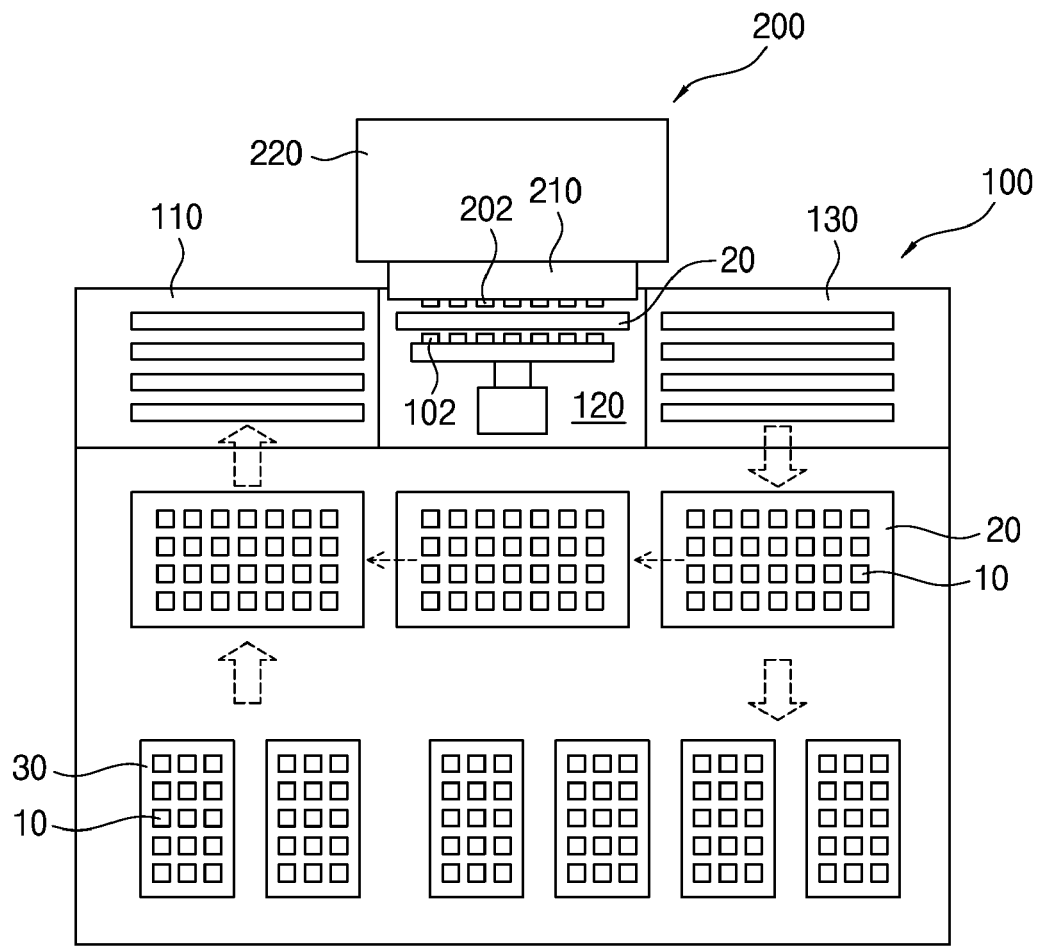
FIG. 2 is a schematic view illustrating a test handler and a tester suitable for testing semiconductor packages using the method as shown in FIG.
Figure 3:
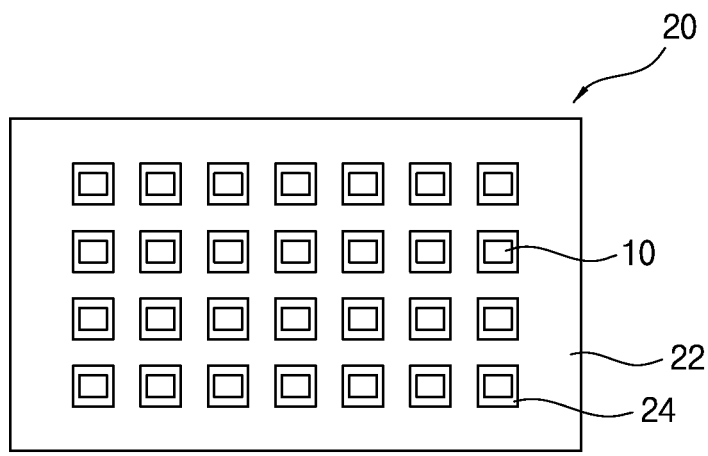
FIG. 3 is a schematic view illustrating a test tray as shown in FIG. 2.

FIG. 1 is a flowchart illustrating a method of testing semiconductor packages in accordance with an exemplary embodiment of the present disclosure, FIG. 2 is a schematic view illustrating a test handler and a tester suitable for testing semiconductor packages using the method as shown in FIG, and FIG. 3 is a schematic view illustrating a test tray as shown in FIG. 2.

Referring to FIGS. 1 to 3, a method of testing semiconductor packages, in accordance with an exemplary embodiment of the present disclosure, may be used to electrically test semiconductor packages 10. Particularly, the semiconductor packages 10 may be received into insert pockets 24 of a test tray 20 and electrically connected with a tester 200 by pusher units 102. Then, an electrical test process on the semiconductor packages 10 may be performed by the tester 200.

For example, a test handler 100 may move a test tray 20 in which semiconductor packages 10 are received into a test area, and pusher units 102 for connecting the semiconductor packages 10 with test sockets 202 of a tester 200 may be disposed in the test area. The tester 200 may include an interface board 210 on which the test sockets 202 are disposed.

The test handler 100 may move the semiconductor packages 10 received in a customer tray 30 into the insert pockets 24 of the test tray 20. The test tray 20 in which the semiconductor packages 10 are received may be moved into a soak chamber 110. The test tray 20 moved into the soak chamber 110 may be erected vertically, and the semiconductor packages 10 may be preheated to a predetermined temperature in the soak chamber 110. Then, the test tray 20 may be moved into a test chamber 120, and an electrical test process may be performed in the test chamber 120. Particularly, the test process may be performed after the semiconductor packages 10 are electrically connected with the tester 200 by the pusher units 102. After performing the test process, the test tray 20 may be moved into a de-soak chamber 130, and the semiconductor packages 10 may be recovered to room temperature in the de-soak chamber 130. The test tray 20 may be removed from the de-soak chamber 130, and the semiconductor packages 10 may be sorted into good or defective products according to the result of the electrical test process.

The test tray 20 may include a main body 22 and insert assemblies mounted to the main body 22. The insert assemblies may be disposed in rows and columns, and may each have an insert pocket 24 as shown in FIG. 3.

The tester 200 may include a test body 220 for providing test signals to the semiconductor packages 10 and analyzing output signals from the semiconductor packages 10. The test body 220 may be connected with the semiconductor packages 10 by the test sockets 202 and the interface board 210. The pusher units 102 may be disposed in the test chamber 120 to connect the semiconductor packages 10 with the test sockets 202, and the test handler 100 may include a driving section for operating the pusher units 102.

Figure 4:
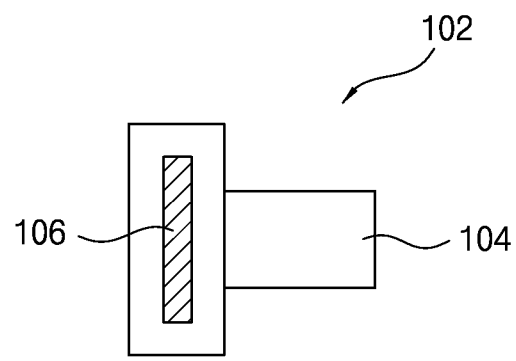
FIG. 4 is a schematic view illustrating a pusher unit as shown in FIG. 2.
Figure 5:
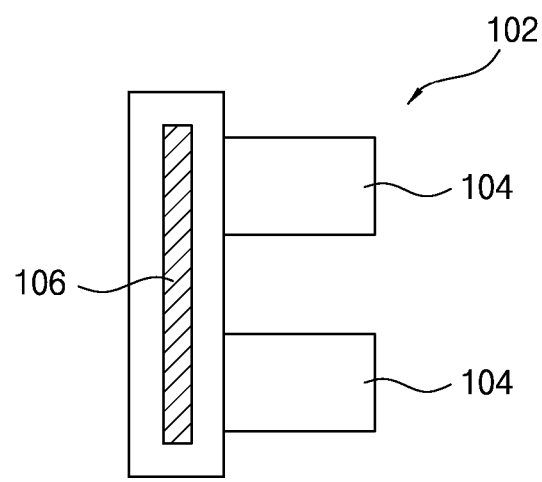
FIG. 5 is a schematic view illustrating another example of the pusher unit as shown in FIG. 4.

FIG. 4 is a schematic view illustrating a pusher unit as shown in FIG. 2, and FIG. 5 is a schematic view illustrating another example of the pusher unit as shown in FIG. 4.

Referring to FIG. 4, each of the pusher units 102 may include a pusher tip 104 for directly pressing the semiconductor package 10 and a heater 106 for heating the semiconductor package 10 through the pusher tip 104. A thermoelectric element may be used as the heater 106, and the operation of the thermoelectric element may be controlled by a controller (not shown).

The pusher unit 102 may include one pusher tip 104 and one heater 106 as shown in FIG. 4. Alternatively, the pusher unit 102 may include one heater 106 and two pusher tips 104 as shown in FIG. 5. Further, though not shown in figures, the pusher unit 102 may include one heater 106 and four pusher tips 104. That is, one heater 106 may be used to heat two or four semiconductor packages 10.

Referring again to FIG. 1, in accordance with an exemplary embodiment of the present disclosure, after the semiconductor packages 10 received in the test tray 20 are electrically connected with the tester 200 by the pusher units 102, an electrical test process on the semiconductor packages 10 may be performed. At this time, the semiconductor packages 10 may be heated to a predetermined test reference temperature by the pusher units 102.

In step S100, a controller (not shown) may receive temperature information of the semiconductor packages 10 from the tester 200 while testing the semiconductor packages 10. For example, each of the semiconductor packages 10 may include a linear temperature compensated self-refresh (Li-TCSR) circuit. The tester 200 may measure self-refresh currents of the semiconductor packages 10 and convert the current values to temperature values. Temperature information including the temperature values may be transmitted from the tester 200 to a controller of the test handler 100. In detail, the Li-TCSR circuit is generally configured to automatically adjust its self-refresh period depending on the operational temperature. The self-refresh current (ISR) is changed depending on the change of the self-refresh period. Thus, the local temperature values may be obtained by measuring the self-refresh currents and converting the current values to the temperature values by the tester 200.

In step S110, the controller may calculate an overall average temperature of the semiconductor packages 10 from the received temperature information.

In step S120, the controller may individually control operations of the heaters 106 of the pusher units 102 based on difference values between the overall average temperature and individual temperatures of the semiconductor packages 10.

For example, in step S120, set temperatures of the heaters 106 may be individually adjusted to compensate for the difference values between the overall average temperature and the individual temperatures of the semiconductor packages 10. Particularly, the individual temperatures of the semiconductor packages 10 may be different from one another depending on the self-heating of the semiconductor packages 10 and/or the operating characteristics of the heaters 106, and the controller may individually increase or decrease the set temperatures of the heaters 106 to compensate for the difference values between the overall average temperature and the individual temperatures of the semiconductor packages 10. As a result, the individual temperatures of the semiconductor packages 10 may be uniformly controlled.

Alternatively, in step S120, the controller may individually increase or decrease driving powers applied to the thermoelectric elements used as the heaters 106 to compensate for the difference values between the overall average temperature and the individual temperatures of the semiconductor packages 10, and thus the individual temperatures of the semiconductor packages 10 may be uniformly controlled.

Further, in step S130, the controller may control overall the operations of the heaters 106 based on a difference value between the overall average temperature and the predetermined test reference temperature of the semiconductor packages 10. For example, in step S130, the controller may adjust the set temperatures of the heaters 106 as a whole to compensate for the difference value between the overall average temperature and the test reference temperature. More specifically, for example, if the calculated overall average temperature is lower than the test reference temperature, the controller may increase overall the set temperatures of the heaters 106 by the difference value between the overall average temperature and the test reference temperature.

Alternatively, in step S130, the controller may increase or decrease as a whole the driving powers applied to the thermoelectric elements used as the heaters 106 to compensate for the difference value between the overall average temperature and the test reference temperature.

According to the above description, although the overall control step S130 is performed after the individual control step S120 is performed, the order of steps S120 and S130 may be changed, and the scope of the present disclosure is not limited thereto.

In accordance with an exemplary embodiment of the present disclosure, a temperature of a semiconductor package 10 deviating from a predetermined temperature range may be excluded from the calculating the overall average temperature of the semiconductor packages 10. For example, an overall average temperature of the semiconductor packages 10 may be firstly calculated, and difference values between the first calculated overall average temperature and the individual temperatures of the semiconductor packages 10 may be calculated. Then, the overall average temperature may be calculated again from temperatures of the remaining semiconductor packages 10 after excluding a temperature of a semiconductor package 10 corresponding to a difference value that deviates from a predetermined temperature range, for example, ±3° C.

Particularly, when a semiconductor package 10 is abnormally received in the insert pocket 24 or a semiconductor package 10 is not normally connected with the test socket 202, a temperature of the semiconductor package 10 may be abnormally high or low. Thus, the reliability of the overall average temperature may be improved by excluding the semiconductor package 10 having the abnormal temperature from the calculating the overall average temperature of the semiconductor packages 10 as described above.

Figure 6:
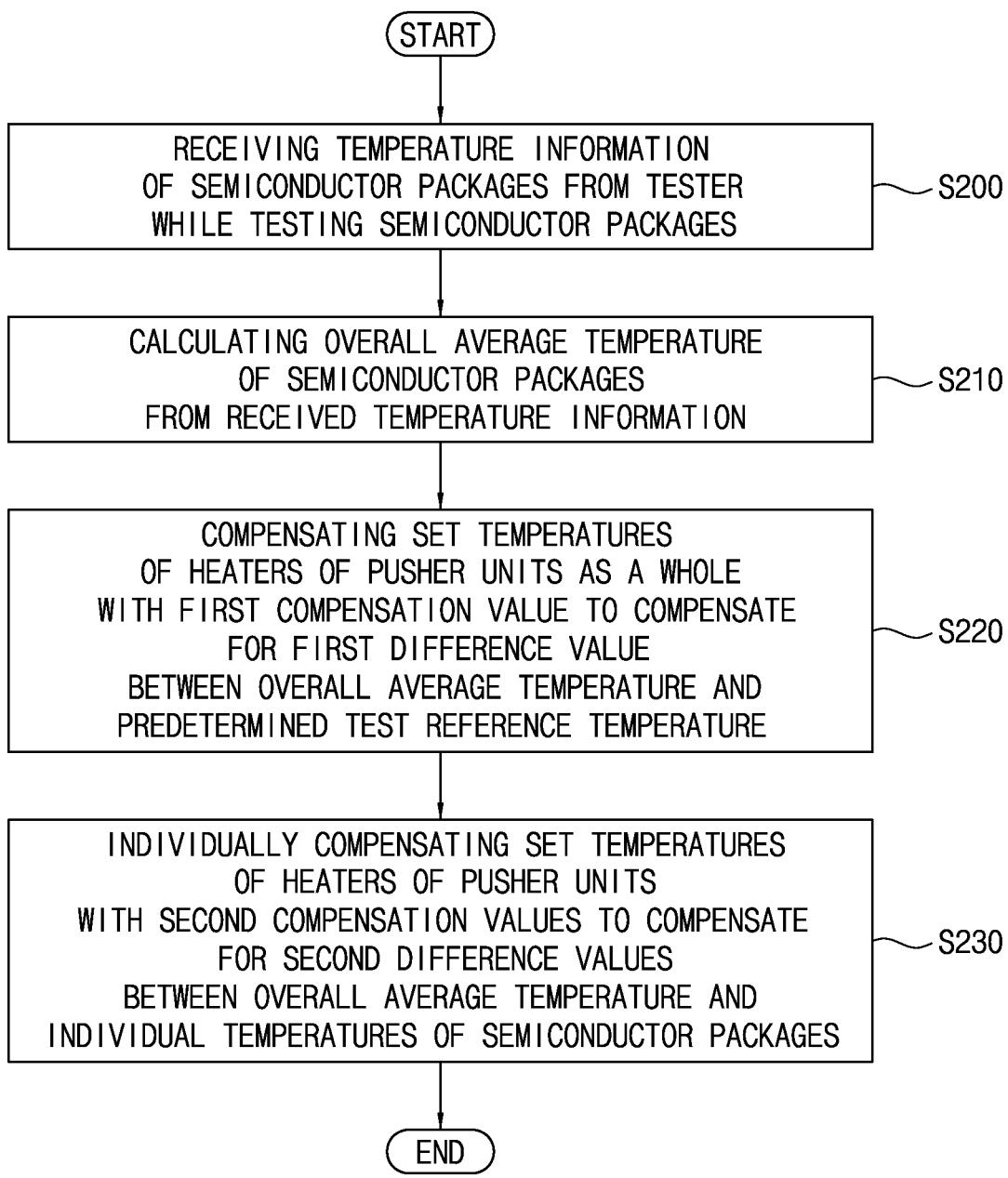
FIG. 6 is a flowchart illustrating a method of testing semiconductor packages in accordance with another exemplary embodiment of the present disclosure.

FIG. 6 is a flowchart illustrating a method of testing semiconductor packages in accordance with another exemplary embodiment of the present disclosure.

Referring to FIG. 6, temperature information of semiconductor packages 10 may be received from the tester 200 while testing the semiconductor packages 10 in step S200, and an overall average temperature of the semiconductor packages 10 may be calculated from the received temperature information in step S210.

In step S220, set temperatures of the heaters 106 of the pusher units 102 may be compensated as a whole with a first compensation value to compensate for a first difference value between the overall average temperature and a predetermined test reference temperature of the semiconductor packages 10. Further, in step S230, the set temperatures of the heaters 106 may be individually compensated with second compensation values to compensate for second difference values between the overall average temperature and individual temperatures of the semiconductor packages 10.

Particularly, the set temperatures of the heaters 106 compensated with the first compensation value and the second compensation values may be used to test subsequent semiconductor packages. Further, a temperature of a semiconductor package 10 deviating from a predetermined temperature range may be excluded from the calculating the overall average temperature of the semiconductor packages 10.

Figure 7:
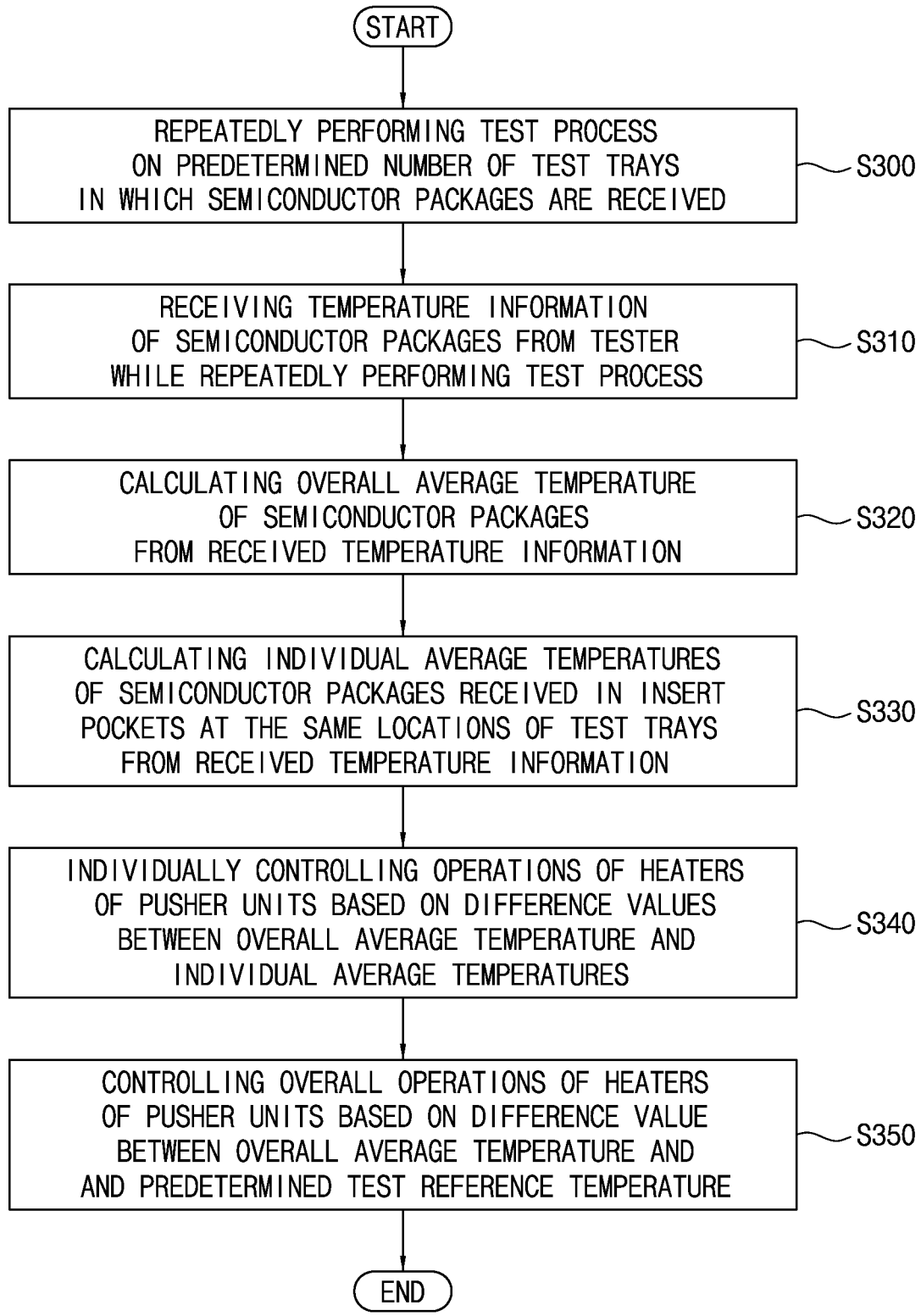
FIG. 7 is a flowchart illustrating a method of testing semiconductor packages in accordance with still another exemplary embodiment of the present disclosure.

FIG. 7 is a flowchart illustrating a method of testing semiconductor packages in accordance with still another exemplary embodiment of the present disclosure.

Referring to FIG. 7, a test process on a predetermined number of test trays 20 in which semiconductor packages 10 are received may be repeatedly performed in step S300, and temperature information of the semiconductor packages 10 received in the test trays 20 may be received from the tester 200 while repeatedly performing the test process in step S310.

Then, an overall average temperature of the semiconductor packages 10 received in the test trays 20 may be calculated from the received temperature information in step S320, and individual average temperatures of semiconductor packages 10 received in insert pockets 24 at the same locations of the test trays 20 may be calculated from the received temperature information, respectively, in step S330. Further, operations of the heaters 106 of the pusher units 102 may be individually controlled based on difference values between the overall average temperature and individual average temperatures of the semiconductor packages 10 in step S340.

Particularly, in step S330, for example, a first individual average temperature may be calculated from temperature information of semiconductor packages 10 each received in first insert pockets 24 of the test trays 20, and a second individual average temperature may be calculated from temperature information of semiconductor packages 10 each received in second insert pockets 24 of the test trays 20. The individual average temperatures of the semiconductor packages 10 received in the insert pockets 24 of the test trays 20 may be calculated in the same manner as described above, and the calculated individual average temperatures may be compared with the overall average temperature.

Further, in step S350, the operations of the heaters 106 may be controlled as a whole based on a difference value between the overall average temperature and a predetermined test reference temperature of the semiconductor packages 10.

Particularly, set temperatures of the heaters 106 may be individually adjusted to compensate for the difference values between the overall average temperature and the individual average temperatures of the semiconductor packages 10 in step S340, and the set temperatures of the heaters 106 may be adjusted as a whole to compensate for the difference value between the overall average temperature and the test reference temperature in step S350.

Alternatively, driving powers applied to thermoelectric elements used as the heaters 106 may be individually increased or decreased to compensate for the difference values between the overall average temperature and the individual average temperatures of the semiconductor packages 10 in step S340, and the driving powers applied to the thermoelectric elements may be increased or decreased as a whole to compensate for the difference value between the overall average temperature and the test reference temperature in step S350.

Further, a temperature of a semiconductor package 10 deviating from a predetermined temperature range may be excluded from the calculating the overall average temperature (S320) and the calculating the individual average temperatures (S330).

Figure 8:
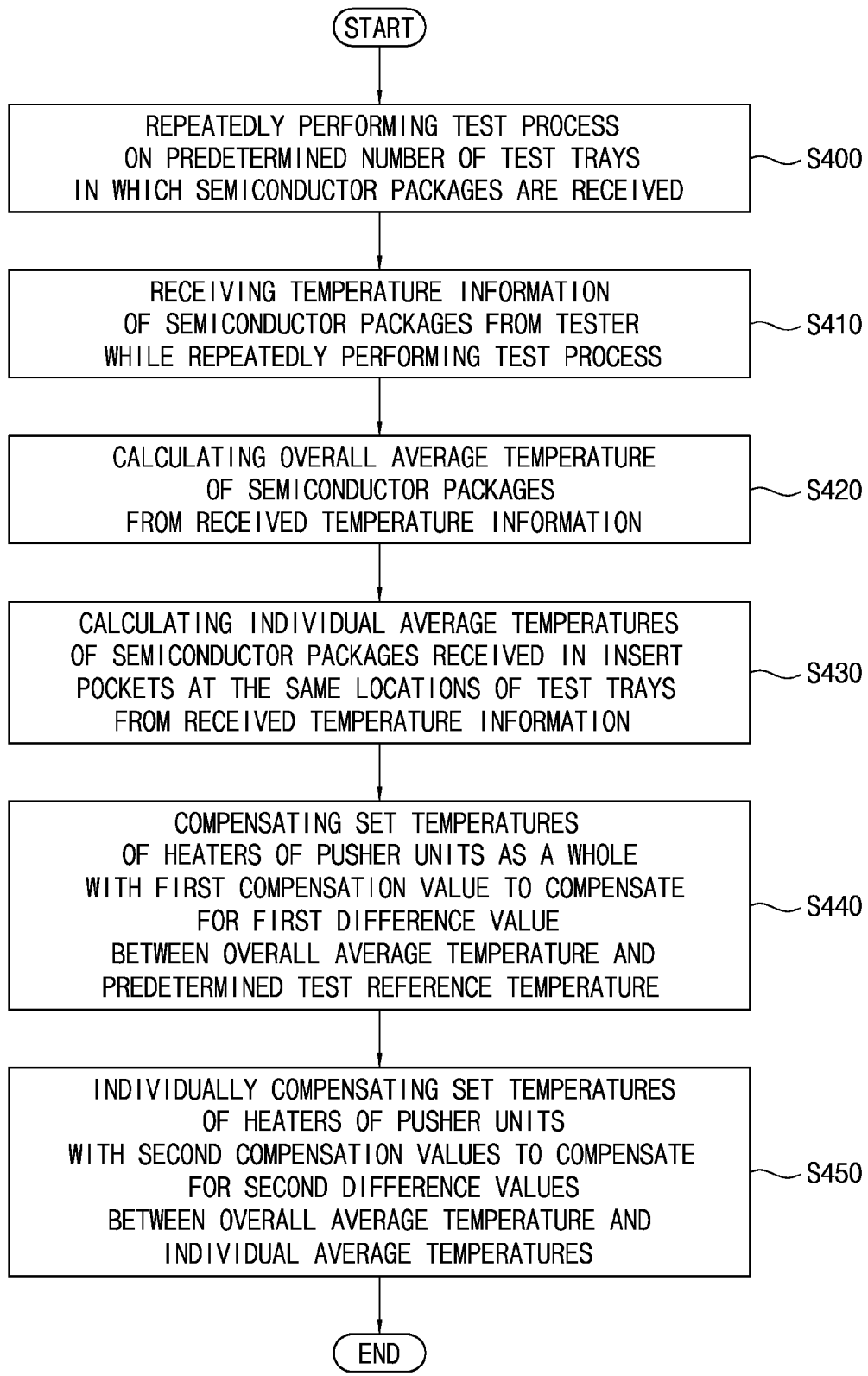
FIG. 8 is a flowchart illustrating a method of testing semiconductor packages in accordance with still another exemplary embodiment of the present disclosure.

FIG. 8 is a flowchart illustrating a method of testing semiconductor packages in accordance with still another exemplary embodiment of the present disclosure.

Referring to FIG. 8, a test process on a predetermined number of test trays 20 in which semiconductor packages 10 are received may be repeatedly performed in step S400, and temperature information of the semiconductor packages 10 received in the test trays 20 may be received from the tester 200 while repeatedly performing the test process in step S410.

Then, an overall average temperature of the semiconductor packages 10 received in the test trays 20 may be calculated from the received temperature information in step S420, and individual average temperatures of semiconductor packages 10 received in insert pockets 24 at the same locations of the test trays 20 may be calculated from the received temperature information, respectively, in step S430.

Further, set temperatures of the heaters 106 of the pusher units 102 may be compensated as a whole with a first compensation value to compensate for a first difference value between the overall average temperature and a predetermined test reference temperature of the semiconductor packages 10 in step S440, and the set temperatures of the heaters 106 may be individually compensated with second compensation values to compensate for second difference values between the overall average temperature and individual average temperatures of the semiconductor packages 10 in step S450.

Particularly, the set temperatures of the heaters 106 compensated with the first compensation value and the second compensation values may be used to test subsequent semiconductor packages. Further, a temperature of a semiconductor package 10 deviating from a predetermined temperature range may be excluded from the calculating the overall average temperature (S420) and the calculating the individual average temperatures (S430).

In accordance with the exemplary embodiments of the present disclosure as described above, temperature information of the semiconductor packages 10 may be received from the tester 200 while testing the semiconductor packages 10; an overall average temperature of the semiconductor packages 10 may be calculated from the received temperature information; and operations of the heaters 106 of the pusher units 102 may be individually controlled based on difference values between the overall average temperature and individual temperatures of the semiconductor packages 10. Further, the operations of the heaters 106 may be controlled overall based on a difference value between the overall average temperature and a predetermined test reference temperature of the semiconductor packages 10.

Thus, the temperature of the semiconductor packages 10 may be more uniformly maintained in the test process of the semiconductor packages 10 and may be controlled to be substantially equal to the test reference temperature. As a result, the reliability of the test results of the semiconductor packages 10 may be significantly improved. In addition, since temperature information of the semiconductor packages 10 is received from the tester 200, temperature sensors are not required, and thus the manufacturing and operation costs of the test handler 100 can be greatly reduced.

Although the methods of testing semiconductor packages have been described with reference to specific embodiments, they are not limited thereto. Therefore, it will be readily understood by those skilled in the art that various modifications and changes can be made thereto without departing from the spirit and scope of the present disclosure defined by the appended claims.

The invention claimed is:

1. A method of testing semiconductor packages, which performs an electrical test on the semiconductor packages after receiving the semiconductor packages into insert pockets of a test tray and connecting with sockets of a tester by using pusher units each comprising a heater, the method comprising:

receiving temperature information of the semiconductor packages from the tester while testing the semiconductor packages;

calculating an overall average temperature of the semiconductor packages from the received temperature information; and individually controlling operations of heaters of the pusher units based on difference values between the overall average temperature and individual temperatures of the semiconductor packages.

2. The method of claim 1, wherein set temperatures of the heaters are individually adjusted to compensate for the difference values between the overall average temperature and the individual temperatures of the semiconductor packages in the individually controlling the operations of the heaters.

3. The method of claim 1, wherein thermoelectric elements are used as the heaters, and driving powers applied to the thermoelectric elements are individually increased or decreased to compensate for the difference values between the overall average temperature and the individual temperatures of the semiconductor packages in the individually controlling the operations of the heaters.

4. The method of claim 1, further comprising controlling overall the operations of the heaters based on a difference value between the overall average temperature and a predetermined test reference temperature of the semiconductor packages.

5. The method of claim 4, wherein set temperatures of the heaters are adjusted as a whole to compensate for the difference value between the overall average temperature and the test reference temperature in the controlling overall the operations of the heaters.

6. The method of claim 4, wherein thermoelectric elements are used as the heaters, and driving powers applied to the thermoelectric elements are increased or decreased as a whole to compensate for the difference value between the overall average temperature and the test reference temperature in the controlling overall the operations of the heaters.

7. The method of claim 1, wherein a temperature of a semiconductor package deviating from a predetermined temperature range is excluded from the calculating the overall average temperature of the semiconductor packages.

8. A method of testing semiconductor packages, which performs an electrical test on the semiconductor packages after receiving the semiconductor packages into insert pockets of a test tray and connecting with sockets of a tester by using pusher units each comprising a heater, the method comprising:
receiving temperature information of the semiconductor packages from the tester while testing the semiconductor packages;
calculating an overall average temperature of the semiconductor packages from the received temperature information;
compensating set temperatures of heaters of the pusher units as a whole with a first compensation value to compensate for a first difference value between the overall average temperature and a predetermined test reference temperature of the semiconductor packages; and
individually compensating the set temperatures of the heaters with second compensation values to compensate for second difference values between the overall average temperature and individual temperatures of the semiconductor packages.

9. The method of claim 8, wherein the set temperatures of the heaters compensated with the first compensation value and the second compensation values are used to test subsequent semiconductor packages.

10. The method of claim 8, wherein a temperature of a semiconductor package deviating from a predetermined temperature range is excluded from the calculating the overall average temperature of the semiconductor packages.

11. A method of testing semiconductor packages, which performs an electrical test on the semiconductor packages after receiving the semiconductor packages into insert pockets of a test tray and connecting with sockets of a tester by using pusher units each comprising a heater, the method comprising:
repeatedly performing a test process on a predetermined number of test trays in which semiconductor packages are received;
receiving temperature information of the semiconductor packages received in the test trays from the tester while repeatedly performing the test process;
calculating an overall average temperature of the semiconductor packages received in the test trays from the received temperature information;
calculating individual average temperatures of semiconductor packages received in insert pockets at the same locations of the test trays from the received temperature information, respectively; and
individually controlling operations of heaters of the pusher units based on difference values between the overall average temperature and individual average temperatures of the semiconductor packages.

12. The method of claim 11, further comprising controlling overall the operations of the heaters based on a difference value between the overall average temperature and a predetermined test reference temperature of the semiconductor packages.

13. The method of claim 12, wherein set temperatures of the heaters are individually adjusted to compensate for the difference values between the overall average temperature and the individual average temperatures of the semiconductor packages in the individually controlling the operations of the heaters; and
the set temperatures of the heaters are adjusted as a whole to compensate for the difference value between the overall average temperature and the test reference temperature in the controlling overall the operations of the heaters.

14. The method of claim 12, wherein thermoelectric elements are used as the heaters;
driving powers applied to the thermoelectric elements are individually increased or decreased to compensate for the difference values between the overall average temperature and the individual average temperatures of the semiconductor packages in the individually controlling the operations of the heaters; and
the driving powers applied to the thermoelectric elements are increased or decreased as a whole to compensate for the difference value between the overall average temperature and the test reference temperature in the controlling overall the operations of the heaters.

15. The method of claim 11, wherein a temperature of a semiconductor package deviating from a predetermined temperature range is excluded from the calculating the overall average temperature and the calculating the individual average temperatures.

16. A method of testing semiconductor packages, which performs an electrical test on the semiconductor packages after receiving the semiconductor packages into insert pockets of a test tray and connecting with sockets of a tester by using pusher units each comprising a heater, the method comprising:

repeatedly performing a test process on a predetermined number of test trays in which semiconductor packages are received;
receiving temperature information of the semiconductor packages received in the test trays from the tester while repeatedly performing the test process;
calculating an overall average temperature of the semiconductor packages received in the test trays from the received temperature information;
calculating individual average temperatures of semiconductor packages received in insert pockets at the same locations of the test trays from the received temperature information, respectively;
compensating set temperatures of heaters of the pusher units as a whole with a first compensation value to compensate for a first difference value between the overall average temperature and a predetermined test reference temperature of the semiconductor packages; and
individually compensating the set temperatures of the heaters with second compensation values to compensate for second difference values between the overall average temperature and individual average temperatures of the semiconductor packages.

17. The method of claim 16, wherein the set temperatures of the heaters compensated with the first compensation value and the second compensation values are used to test subsequent semiconductor packages.

18. The method of claim 16, wherein a temperature of a semiconductor package deviating from a predetermined temperature range is excluded from the calculating the overall average temperature and the calculating the individual average temperatures.

19. The method of claim 16, wherein each of the pusher units comprises one heater and one pusher tip or a plurality of pusher tips.

* * * * *